(12) United States Patent
Kar-Roy et al.

(10) Patent No.: US 6,430,028 B1
(45) Date of Patent: Aug. 6, 2002

(54) METHOD FOR FABRICATION OF AN MIM CAPACITOR AND RELATED STRUCTURE

(75) Inventors: Arjun Kar-Roy, Irvine; Marco Racanelli, Orange, both of CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 09/721,342

(22) Filed: Nov. 22, 2000

(51) Int. Cl.[7] .......................... H01G 4/228; H01G 4/06
(52) U.S. Cl. ..................... 361/306.3; 361/311; 361/313
(58) Field of Search .......................... 361/301.4, 306.3, 361/311–313, 303, 329; 257/306, 310, 295, 296, 277, 750, 751, 753

(56) References Cited

U.S. PATENT DOCUMENTS

| | | | |
|---|---|---|---|
| 5,216,572 A | * | 6/1993 | Larson et al. ................ 361/313 |
| 5,631,804 A | * | 5/1997 | New ............................ 257/295 |
| 5,801,916 A | * | 9/1998 | New ............................ 257/295 |
| 5,825,609 A | * | 10/1998 | Andricacos et al. ...... 361/321.4 |
| 5,925,932 A | * | 7/1999 | Tran et al. ................... 257/750 |
| 6,144,051 A | * | 11/2000 | Nishimura et al. .......... 257/277 |
| 6,344,964 B1 | * | 2/2002 | Adler ......................... 361/306.3 |

* cited by examiner

Primary Examiner—Anthony Dinkins
(74) Attorney, Agent, or Firm—Farjami & Farjami LLP

(57) ABSTRACT

According to a disclosed embodiment, an interconnect metal layer is deposited. The interconnect metal layer can be, for example, aluminum, copper, or an aluminum-copper alloy. Then a first dielectric is fabricated over the interconnect metal layer. The first dielectric can be, for example, silicon nitride. A top metal layer is then formed over the first dielectric. The top metal layer can be, for example, titanium nitride. Next, the top metal layer and the first dielectric are patterned and etched to form a capacitor first electrode and a capacitor dielectric. Thereafter a layer of a second dielectric is deposited over the capacitor first electrode and the capacitor dielectric. The second dielectric can be, for example, silicon oxide. Then the second dielectric is etched back, as a result of which spacers covering common sidewalls of the capacitor first electrode and the capacitor dielectric are formed. The spacers protect the capacitor dielectric from being etched during subsequent Processing steps. In one embodiment, a structure fabricated according to the process steps discussed above.

10 Claims, 3 Drawing Sheets

METHOD FOR FABRICATION OF AN MIM CAPACITOR AND RELATED STRUCTURE

BACKGROUND OF THE INVENTION

1. Field of the Invention

The present invention is generally in the field of semiconductor chips. More specifically, the invention is in the field of capacitors used in semiconductor chips.

2. Background Art

High performance CMOS and BiCMOS mixed signal and RF circuits require integrated capacitors with precision control of capacitor values and good capacitor matching, along with high reliability, low defect density, a high quality factor ("Q"), and low parasitic capacitance.

Metal-insulator-metal ("MIM") capacitors have been successfully integrated into an existing multi-level metallization process used in the fabrication of integrated mixed signal and RF circuits on semiconductor chips. When MIM capacitors are fabricated at the second metallization layer or higher, parasitic capacitance is reduced due to the increased distance of the capacitor from the substrate. In addition, the quality factor of MIM capacitors, i.e. the ratio of stored energy to dissipated energy, is higher than conventional poly-poly and metal-poly capacitors due to the lower resistance of the top and bottom plates of the MIM capacitor.

In addition to the benefits of MIM capacitors described above, more precise control of capacitor values, as well as better capacitor matching and lower defect density of capacitor dielectrics have been realized through the utilization of various MIM capacitor fabrication techniques. However, due to their importance in semiconductor applications, device engineers are continually looking for ways to further improve these capacitor characteristics.

A number of semiconductor applications require accurate "matching" of capacitors. Capacitors are matched if their absolute values can be determined and replicated with accuracy. In addition, efforts have been made to further reduce the defect density of capacitor dielectrics. Defect density refers to the number of defects within a defined area of the capacitor dielectric, for example, defects/cm² of the capacitor dielectric. A high defect density in a capacitor dielectric leads to problems such as shorted capacitors, higher leakage current, i.e. undesired current flow through the capacitor, and lower breakdown voltage, i.e. the voltage applied to the capacitor at which the capacitor dielectric no longer acts as an insulator, and thus reduces the long-term reliability of the capacitor.

FIG. 1 shows a cross section of conventional MIM capacitor 100 fabricated on a semiconductor die. Dielectric 106 is shown situated between top plate 108 and bottom plate 104. Bottom plate 104 rests on top of a first inter-layer dielectric ("ILD") 102 which in turn rests on a metal layer or a semiconductor substrate (not shown in FIG. 1). Top plate 108 can be made of conductive material such as titanium nitride while bottom plate 104 can be made of a different conductive material such as an aluminum-copper alloy. Dielectric 106 is typically made of silicon nitride or silicon oxide, while ILD 102 is typically silicon oxide.

A known process flow of MIM capacitor fabrication begins with the deposition of an interconnect metal layer on top of a first inter-layer dielectric. A thin layer of capacitor dielectric film is then deposited on top of the interconnect metal layer. Another metal layer is then deposited on top of the capacitor dielectric. A top plate is then patterned and etched out of the top metal layer with an etch chemistry selective to the top plate metal. Etch stop is used on the capacitor dielectric film to prevent etching of the capacitor dielectric film during this step. This top plate functions as a first electrode of the MIM capacitor.

A bottom plate is subsequently patterned and etched to form a second electrode of the MIM capacitor. During this step, residual capacitor dielectric film, i.e. all of the layer of capacitor dielectric film except that portion that will be between the top plate and bottom plate of the capacitor, is first etched away, followed by the etching of the bottom plate. The photoresist used to define the patterning of the bottom plate is then removed using dry etch, wet etch, or a combination of both. Subsequent to the patterning and etching of the bottom plate of the capacitor, a second layer of ILD (not shown in FIG. 1) is deposited on top of the first layer of ILD and surrounds the MIM capacitor comprising the top plate, capacitor dielectric, and bottom plate. This second ILD layer can also be silicon oxide.

It is well-known that the capacitance value between the two plates of a parallel plate capacitor, such as the MIM capacitor shown in FIG. 1, is calculated by the equation:

$$C_a = \frac{\varepsilon_0 \varepsilon_r A}{t} \qquad \text{(Equation 1)}$$

where $\varepsilon_0$ is the permittivity of the free space ($\varepsilon_0 = 8.85 \times 10^{-14}$ F/cm), $\varepsilon_r$ is the relative permittivity (also referred to as the dielectric constant or "k"), A is the surface area of plate 104 (or plate 108) and t is the thickness of dielectric layer 106. In addition to the area component as given by Ca above, a parasitic perimeter component also exists. The parasitic perimeter capacitance is obtained from the fringing fields between the edges of the top and bottom plates of the capacitor. Thus, the total capacitance may be expressed as $$C = AC_A + PC_P \qquad \text{(Equation 2)}$$

where $C_A$=capacitance per unit area =$C_a/A$, $C_P$=perimeter capacitance per unit length, and P=perimeter of the capacitor (or perimeter of plate 104 or 108).

Given the capacitance Equation 1, it can be seen that the value of the capacitance is proportional to the dielectric constant of the capacitor's dielectric. Variations in the dielectric constant of the capacitor dielectric, such as capacitor dielectric 106, result in variations in the capacitance value and thus makes matching of capacitors difficult. In addition to the relation of the capacitor dielectric to capacitor matching, many other important characteristics of the capacitor are dependent on the capacitor dielectric. As discussed above, defects or voids in the capacitor dielectric result in an increased leakage current through the capacitor. Also, the breakdown voltage of the capacitor is a function of the strength and defect density of the capacitor dielectric.

As a result of the dependency on the capacitor dielectric of such important characteristics of the capacitor as capacitance matching, breakdown voltage, and leakage current, device engineers wish to maintain the integrity of the capacitor dielectric during the semiconductor die fabrication process to ensure that the desired characteristics of the capacitor will be preserved.

However, an undesired byproduct of the known MIM capacitor formation process described above is the undercutting of the capacitor dielectric along the perimeter sidewalls of the capacitor dielectric. This not only affects the value of the capacitor, but may also weaken the dielectric at the edge of the capacitor due to voids and defects, thus increasing the leakage current as well as reducing the breakdown voltage of the capacitor. This capacitor dielectric undercutting is a result of the attack of the exposed dielectric along the perimeter of the capacitor during subsequent etching and patterning of bottom plate 104 of the MIM capacitor, as discussed below.

Dry etch fluorinated chemistries such as nitrogen trifluoride ("$NF_3$"), carbon terafluoride ("$CF_4$") and sulphur hexafluoride ("$SF_6$"), are commonly used in MIM capacitor formation to strip the photoresist after etching the bottom plate of the capacitor from the interconnect metal layer. These etch chemistries attack the capacitor dielectric at the perimeter sidewalls of the capacitor as the perimeter of the capacitor becomes to completely exposed during the bottom plate photoresist strip process. Subsequent wet strips to remove polymers after etching the bottom metal and stripping the resist may also attack the perimeter sidewall in a similar fashion. The result is shown in expanded views 101 and 105 in FIG. 1. After the bottom plate metal etch step, the perimeter sidewalls of capacitor dielectric 106 have been cut back from their original extensions indicated by dashed lines 103 and 107 in expanded views 101 and 105. As such, the perimeter sidewalls of capacitor dielectric 106 and are no longer flush with top plate 108, as shown in expanded views 101 and 105. In addition, the conducting by-products during the dry strip and/or wet strip may impinge on the exposed sidewall of the dielectric causing current leakage paths between the two plates of the capacitor.

As a result of this undercutting of the capacitor dielectric by the etch chemistry used to etch bottom plate 104, voids are created along the perimeter sidewalls of the capacitor. These voids between the top and bottom metal plates will have a different dielectric constant than the remainder of the dielectric material between the top and bottom plates of the capacitor, i.e. the dielectric constant of the voids will essentially be that of the air. Thus, the capacitance value as determined by Equation 1 will vary based on the amount of undercutting of the capacitor dielectric during the bottom plate metal etch step. Therefore, capacitor matching will be very difficult to control because varying capacitor values of different capacitors on the semiconductor die will result based on varying degrees of capacitor dielectric undercutting.

In addition to the difficulty of accurate capacitor matching, voids and defects along the perimeter sidewalls of the capacitor dielectric will result in long term reliability problems such as increased leakage current and a lower breakdown voltage for the capacitor.

Thus it is seen that a reliable MIM capacitor fabrication process is needed that will ensure that the integrity of the capacitor dielectric will be maintained during the resist stripping step and during the patterning of the bottom plate metal, thus ensuring more precise control of capacitor values, accurate capacitor matching of capacitors on the semiconductor die, and improved long-term reliability of the capacitors.

SUMMARY OF THE INVENTION

The present invention is directed to method for fabrication of an MIM capacitor and related structure. The invention is a reliable MIM capacitor fabrication process that ensures that the integrity of the capacitor dielectric is maintained during subsequent process steps, thus ensuring more precise control of capacitor values, accurate capacitor matching of capacitors on the semiconductor die, and improved long-term reliability of the capacitors.

According to one embodiment of the invention, an interconnect metal layer is deposited. The interconnect metal layer can be, for example, aluminum, copper, or an aluminum-copper alloy. Then a first dielectric is fabricated over the interconnect metal layer. The first dielectric can be, for example, silicon nitride, tantalum pentooxide, or silicon oxide. A top metal layer is then formed over the first dielectric. The top metal layer can be, for example, titanium nitride, tantalum nitride, aluminum or a composite stack of these materials.

Next, the top metal layer and the first dielectric are patterned and etched to form a capacitor first electrode and a capacitor dielectric. Thereafter a layer of a second dielectric is deposited over the capacitor first electrode and the capacitor dielectric. The second dielectric can be, for example, silicon oxide. Then the second dielectric is etched back, as a result of which spacers covering common sidewalls of the capacitor first electrode and the capacitor dielectric are formed. The spacers protect the capacitor dielectric from being etched during subsequent processing steps. In one embodiment, the invention is a structure fabricated according to the process steps discussed above.

DETAILED DESCRIPTION OF THE INVENTION

The present invention is directed to method for fabrication of an MIM capacitor and related structure. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

FIGS. 2 through 6 illustrate the various steps in an embodiment of the invention's MIM capacitor fabrication process by showing cross sections 200 of an MIM capacitor on a semiconductor die after each process step. In the present embodiment, a subtractive etch process is used to fabricate the capacitor. However, the invention's method may also be used in conjunction with a damascene process, for example, a copper dual damascene process.

Figure 1:
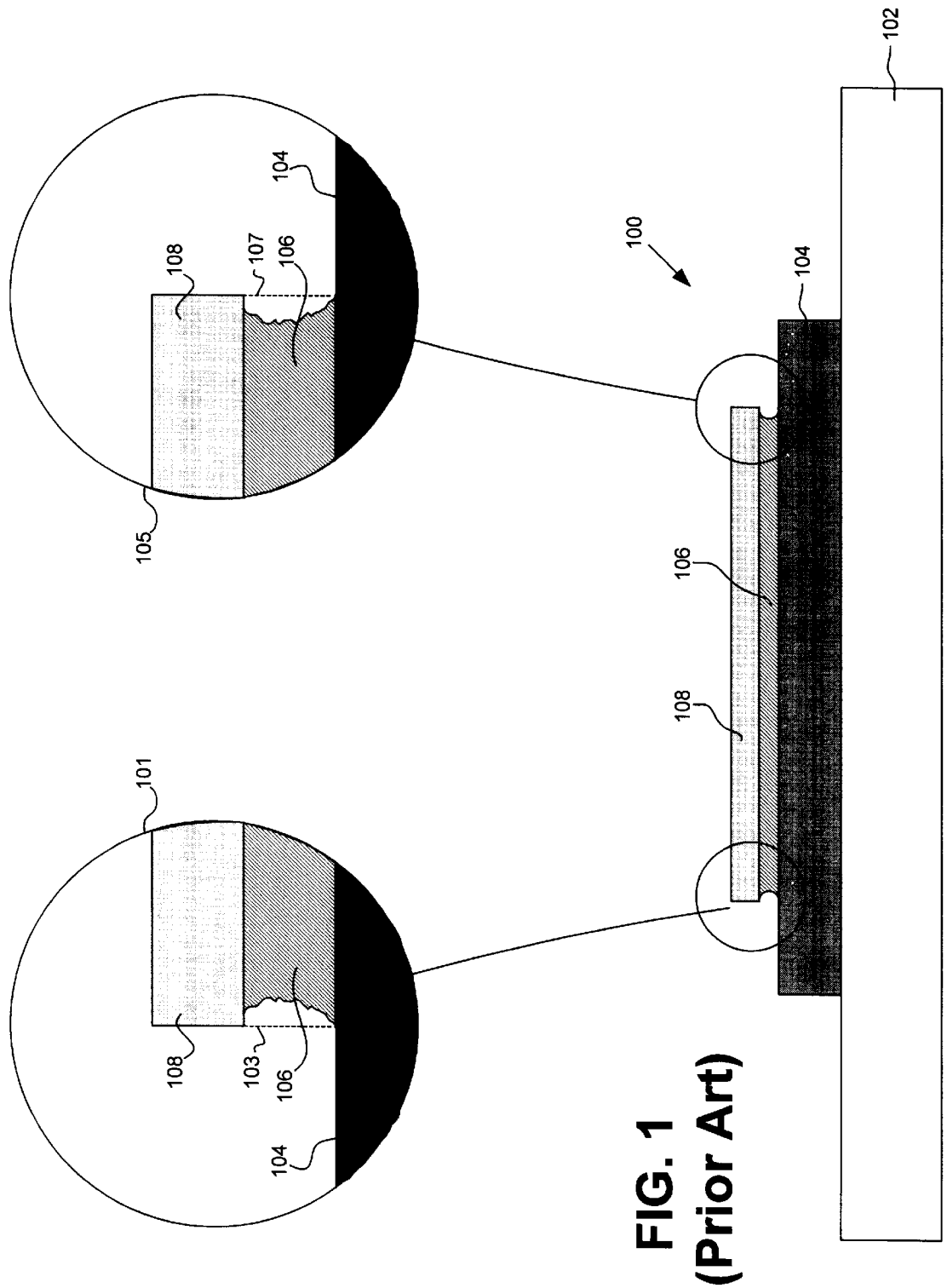
FIG. 1 shows a cross section of conventional MIM capacitor fabricated on a semiconductor die.
Figure 2:
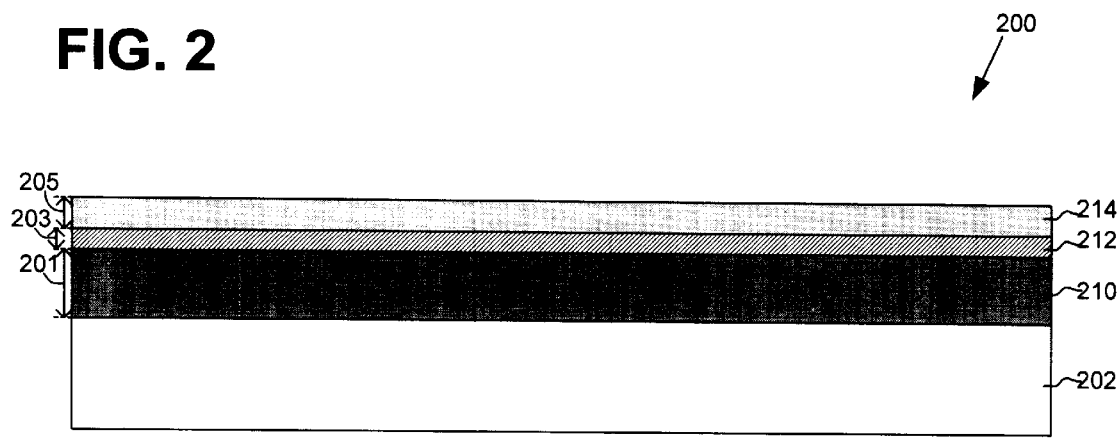
FIG. 2 shows a cross section of a structure formed according to a first process step according to one embodiment of the invention.

FIG. 2 shows the result of the first steps of an embodiment of the invention's process for fabricating an MIM capacitor. Interconnect metal layer 210 has been deposited on top of inter-layer dielectric 202 in a manner known in the art. As an example, thickness 201 of interconnect metal layer 210 can be approximately 6000 Angstroms. Interconnect metal layer 210 can be, for example, aluminum, copper, or an aluminum-copper alloy. Inter-layer dielectric 202 can be silicon oxide.

Capacitor dielectric layer 212 has been deposited on top of interconnect metal layer 210. In the present embodiment, plasma enhanced chemical vapor deposition ("PECVD") is used to deposit capacitor dielectric layer 212. As an example, thickness 203 of capacitor dielectric layer 212 can be approximately 600 Angstroms. Capacitor dielectric layer 212 can be, for example, silicon nitride, silicon oxide, or tantalum pentooxide.

Top metal layer 214 is subsequently deposited on top of capacitor dielectric layer 212. In the present embodiment of the invention, physical vapor deposition ("PVD") is used to deposit top metal layer 214. Thickness 205 of top metal layer 214 is approximately 1500 Angstroms. Top metal layer 214 can be, for example, titanium nitride, tantalum nitride, aluminum or a composite stack of these materials.

Figure 3:
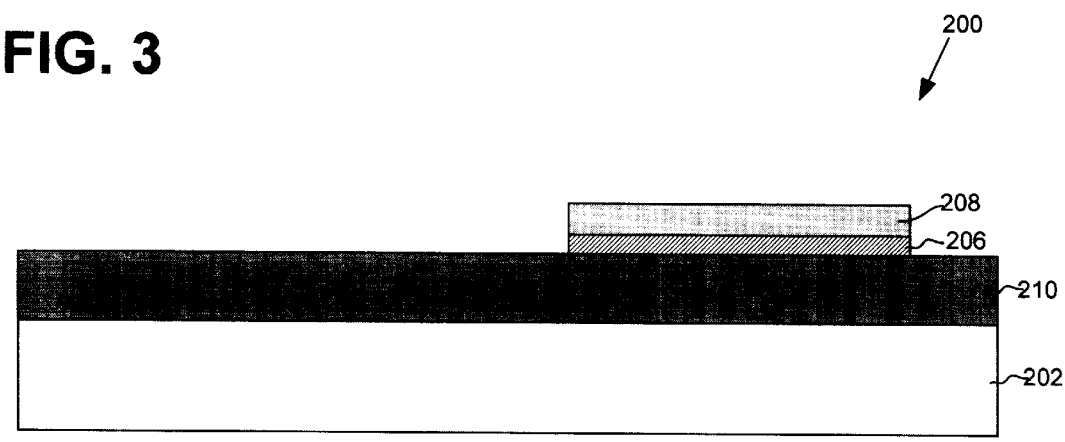
FIG. 3 shows a cross section of an interim structure formed as a result of a subsequent process step according to one embodiment of the invention.

FIG. 3 shows the result of the next step in the present embodiment of the invention. Top metal plate 208 and dielectric 206 have been patterned and etched in a manner known in the art. Top metal plate 208 functions as a first electrode of the MIM capacitor. Dielectric 206 functions as the capacitor dielectric.

Figure 4:
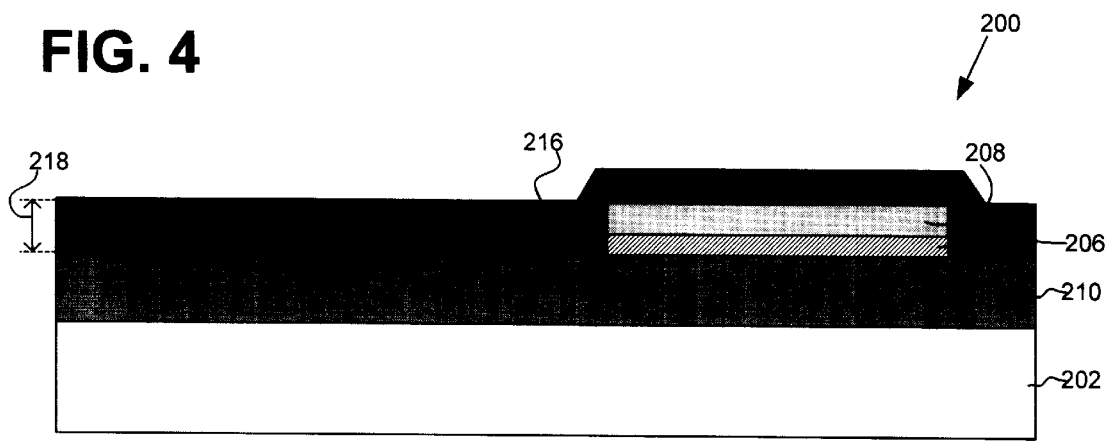
FIG. 4 shows a cross section of an interim structure formed as a result of a subsequent process step according to one embodiment of the invention.

FIG. 4 shows the result of the next step in the present embodiment of the invention. Spacer dielectric layer 216 has been deposited over top metal plate 208 and interconnect metal layer 210. Spacer dielectric layer 216 also surrounds and is in contact with the perimeter sidewalls of top metal plate 208 and dielectric 206. In the present embodiment, spacer dielectric layer 216 deposition is performed by a PECVD process. As an example, thickness 218 of spacer dielectric layer 216 can be approximately 2000 Angstroms. Spacer dielectric layer 216 can be, for example, silicon dioxide or silicon nitride.

Figure 5:
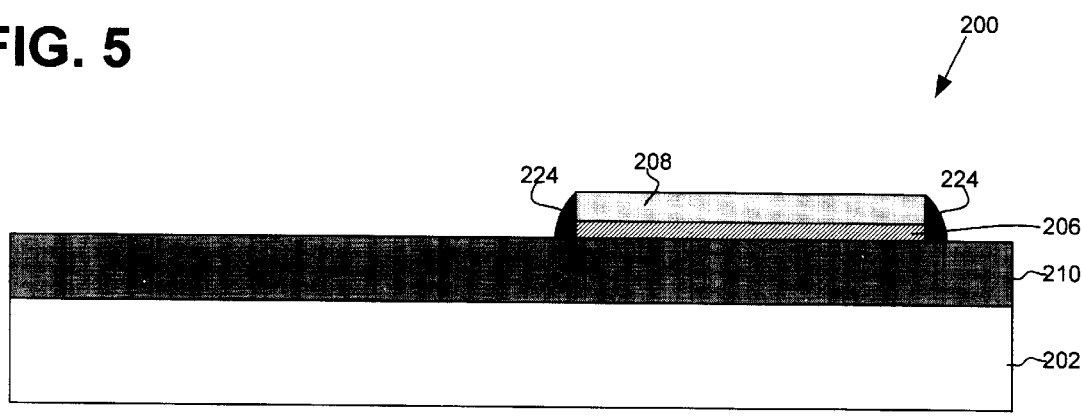
FIG. 5 shows a cross section of an interim structure formed as a result of a subsequent process step according to one embodiment of the invention.

FIG. 5 shows the result of the next step in the present embodiment of the invention. A blanket etch of spacer dielectric layer 216 has been performed without a mask. Thus, almost all of spacer dielectric layer 216 has been "etched back," leaving only small residual portions of spacer dielectric layer 216, referred to spacers 224, which fit snugly against the common perimeter sidewalls of top metal plate 208 and dielectric 206 of the MIM capacitor. Spacers 224 ensure the integrity of dielectric 206 by protecting the perimeter sidewalls of dielectric 206 from attack by the aggressive etch chemistry used during the bottom plate metal etch step discussed below, as well as from attacks by other chemistries used in any further steps in the semiconductor chip fabrication process. The spacer width and height can be varied, for example, by changing the thickness 205 of top metal layer 214, the thickness 218 of spacer dielectric layer 216 and the amount of spacer overetch.

Figure 6:
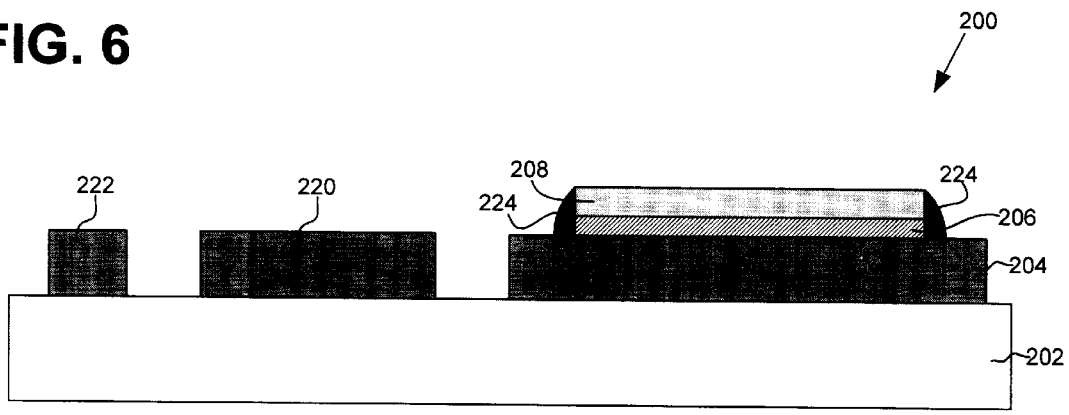
FIG. 6 shows a cross section of an MIM capacitor formed according to one embodiment of the invention.

FIG. 6 shows the result of the next step in present embodiment of the invention. Interconnect metal layer 210 has been patterned and etched to form bottom metal plate 204, and interconnect metal lines 220 and 222. Bottom metal plate 204 acts as the second electrode of the MIM capacitor. The etchant used during this etch step can be nitrogen trifluoride ("$NF_3$"), carbon terafluoride ("$CF_4$"), or sulphur hexafluoride ("$SF_6$"). As discussed above, in the absence of spacers 224 these etchants can attack the perimeter sidewalls of dielectric 206. However, when spacers 224 are present and comprise silicon oxide, the silicon oxide acts as a buffer that isolates the perimeter sidewalls of dielectric 206 from the etchants used to etch interconnect metal layer 210. The addition of the spacers provides a number of benefits in making the manufacturing of the MIM capacitor more robust. First, the spacers provide protection from any chemical attack to the perimeter of the capacitor. Second, the width of the spacers provide an added protection against etchants, which may etch the dielectrics such as silicon oxide, silicon nitride, and silicon oxynitride, in subsequent steps to undercut the perimeter of the capacitor dielectric. Third, the spacers protect the capacitor perimeter, thus reducing the chances of current leakage paths.

If instead of silicon oxide, spacers 224 comprise silicon nitride and, as in the present embodiment, dielectric 206 also comprises silicon nitride, the silicon nitride of spacers 224 will act as a "sacrificial boundary" between the perimeter sidewalls of dielectric 206 and the etchants used to etch interconnect metal layer 210. In other words, any damage resulting from the aggressive etch chemistries used to etch interconnect metal layer 210 will be sustained by the silicon nitride of spacer 224 and not by the silicon nitride of dielectric 206.

Thus, as a result of the protection that spacers 224 provide, there is no undercutting of dielectric 206. Therefore, there is no increase in the leakage current of the capacitor or decrease in the breakdown voltage of the capacitor due to an increase in defects and voids within dielectric 206. In addition, since there is no undercutting of dielectric 206 and thus no voids in dielectric 206 between top metal plate 208 and bottom metal plate 204, the effective capacitance area is more precisely controlled and as such the capacitance value is more precisely predictable as seen from Equation 1. Also, capacitor matching is improved because the absolute values of the capacitors on the semiconductor chip can be determined and replicated with better accuracy. In addition to the benefits of the invention's spacers discussed above, there are additional benefits to the use of the invention's MIM capacitor fabrication process which will be discussed below.

In an aluminum subtractive etch process technology having a minimum aluminum line width of 0.18 $\mu$m, anti-reflection coating ("ARC") is required to maintain better control over smaller images. As an example, a silicon oxynitride ARC film may be utilized to minimize light scattering from the surface of the aluminum line into the photoresist, which helps in the definition of smaller images. However, the ARC films used in semiconductor fabrication can be leaky, i.e. they can contribute to the capacitor leakage current. When these ARC films are integrated into the MIM capacitor fabrication process, the capacitor dielectric may be exposed to these leaky ARC films, thus increasing the capacitor leakage current.

An additional benefit of the invention's MIM capacitor fabrication process is that it avoids exposure of the capacitor dielectric to leaky ARC films through the use of the invention's spacers. As a result of the formation of the invention's spacers 224 by the deposition and etching of dielectric layer 216, as described in relation to FIGS. 4 and 5 above, there will be isolation between the leaky ARC film and dielectric 206, thus minimizing the leakage current of the capacitor.

As discussed above, the invention can also be implemented using a dual damascene process to fabricate an MIM capacitor. In a dual damascene process, a copper metal layer typically acts as the bottom plate of the capacitor. The capacitor dielectric comprises either silicon oxide or silicon nitride. An intermediate metallization layer acts as the top plate of the capacitor. In an example of a known dual damascene MIM capacitor fabrication process, a silicon nitride barrier layer on top of the copper is required to prevent copper diffusion. This silicon nitride barrier layer can be different from silicon nitride dielectric 206 of the MIM capacitor. This silicon nitride barrier layer can be leaky. Thus, if the capacitor dielectric is exposed to the silicon nitride barrier layer, the leakage current of the capacitor will increase. Again, the invention's spacers, when integrated into a copper dual damascene MIM capacitor fabrication process, will isolate the capacitor dielectric from the leaky silicon nitride barrier layer, thus reducing the leakage current of the capacitor.

Thus, it can be seen that the invention's MIM capacitor fabrication process ensures that the integrity of the capacitor dielectric will be maintained during the bottom fT plate metal etch step, thus ensuring more precise control of capacitor values, accurate capacitor matching of capacitors on the semiconductor die, and improved long-term reliability of the capacitors. In addition to these benefits, the invention's MIM capacitor fabrication process prevents an increased capacitor leakage current when ARC films are integrated into an aluminum subtractive etch process or when a silicon nitride barrier is layer is used in a copper dual damascene process.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, method for fabrication of an MIM capacitor and related structure have been described.

What is claimed is:

1. A capacitor comprising:
   a first metal plate forming a first electrode of said capacitor;
   a first dielectric situated below said first metal plate;
   a spacer covering a common sidewall of said first dielectric and said first metal plate without covering a top surface of said first metal plate, said spacer being fabricated by a maskless etch back process wherein said spacer substantially protects said first dielectric from being etched;
   a second metal plate below said first dielectric, said second metal plate being etched to form a second electrode of said capacitor after said spacer is fabricated.

2. The capacitor of claim 1 wherein said first dielectric is selected from the group consisting of silicon nitride, tantalum pentooxide, and silicon oxide.

3. The capacitor of claim 1 wherein said spacer comprises silicon oxide.

4. The capacitor of claim 1 wherein said first dielectric is selected from the group consisting of silicon nitride, tantalum pentooxide, and silicon oxide, and wherein said spacer comprises silicon oxide.

5. The capacitor of claim 1 wherein said first metal plate comprises metal selected from the group consisting of titanium nitride, tantalum nitride, and aluminum.

6. The capacitor of claim 1 wherein said second metal plate is selected from the group consisting of aluminum, copper, and aluminum-copper alloy.

7. The capacitor of claim 1 wherein said first metal plate comprises metal selected from the group consisting of titanium nitride, tantalum nitride, and aluminum and wherein said second metal plate comprises metal selected from the group consisting of aluminum, copper, and aluminum-copper alloy.

8. The capacitor of claim 1 wherein said spacer substantially protects said first dielectric from being etched by a nitrogen trifluoride based etchant.

9. The capacitor of claim 1 wherein said spacer substantially protects said first dielectric from being etched by a carbon terafluoride based etchant.

10. The capacitor of claim 1 wherein said spacer substantially protects said first dielectric from being etched by a sulphur hexafluoride based etchant.

* * * * *